United States Patent
Liao et al.

(10) Patent No.: US 12,287,590 B2
(45) Date of Patent: *Apr. 29, 2025

(54) REDUCE MASK DEFECT IMPACT BY CONTAMINATION DECOMPOSE

(71) Applicant: TAIWAN SEMICONDUCTOR MANUFACTURING COMPANY, LTD., Hsinchu (TW)

(72) Inventors: Chi-Hung Liao, Sanchong (TW); Po-Ming Shih, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/196,916

(22) Filed: May 12, 2023

(65) Prior Publication Data
US 2023/0280665 A1 Sep. 7, 2023

Related U.S. Application Data

(63) Continuation of application No. 17/358,776, filed on Jun. 25, 2021, now Pat. No. 11,687,012.

(51) Int. Cl.
*G03F 7/00* (2006.01)
*G03F 1/82* (2012.01)

(52) U.S. Cl.
CPC ............ *G03F 7/70925* (2013.01); *G03F 1/82* (2013.01); *G03F 7/70741* (2013.01)

(58) Field of Classification Search
CPC ..... G03F 7/70925; G03F 7/70625; G03F 1/82
See application file for complete search history.

(56) References Cited

U.S. PATENT DOCUMENTS 10,317,801 B2   6/2019 Wang
11,687,012 B2 *  6/2023 Liao .................... G03F 7/70925
                                                             355/30

(Continued)

FOREIGN PATENT DOCUMENTS

CN        106324998 A       1/2017
JP        2002270501 A      9/2002

(Continued)

OTHER PUBLICATIONS

The machine translation of JP-2008300683-A (Year: 2008).*

(Continued)

*Primary Examiner* — Steven H Whitesell
(74) *Attorney, Agent, or Firm* — STUDEBAKER BRACKETT PLLC

(57) ABSTRACT

A method comprises cleaning a surface of a reticle by irradiating the surface of the reticle in a first exposure device for a predetermined irradiation time. A layout pattern of the reticle is projected onto a photo resist layer of a wafer in a second exposure device by an EUV radiation. The photo resist layer is developed to generate a photo resist pattern on the wafer. A surface of the wafer is imaged to generate an image of the photo resist pattern on the wafer. The generated image of the photo resist pattern is analyzed to determine critical dimension uniformity (CDU) of the photo resist pattern. The predetermined irradiation time is adjusted until the determined CDU satisfies a predetermined criterion.

20 Claims, 11 Drawing Sheets

(56) References Cited

U.S. PATENT DOCUMENTS

| | | |
|---|---|---|
| 2001/0026355 A1 | 10/2001 | Aoki et al. |
| 2004/0090605 A1 | 5/2004 | Yogev et al. |
| 2004/0196446 A1 | 10/2004 | Irie |
| 2005/0057734 A1 | 3/2005 | Johannes Stevens et al. |
| 2006/0082743 A1 | 4/2006 | Yonekawa et al. |
| 2006/0086371 A1* | 4/2006 | Ohkubo .............. G03F 7/70916 134/1 |
| 2007/0013892 A1 | 1/2007 | Osawa et al. |
| 2008/0088810 A1 | 4/2008 | Huh et al. |
| 2009/0020137 A1 | 1/2009 | Osawa et al. |
| 2009/0027639 A1 | 1/2009 | Phillips et al. |
| 2014/0261568 A1 | 9/2014 | Delgado et al. |
| 2017/0031241 A1 | 2/2017 | Shen et al. |

FOREIGN PATENT DOCUMENTS

| | | | |
|---|---|---|---|
| JP | 2008300683 A | * | 12/2008 |
| TW | 511139 B | | 11/2002 |
| TW | 200804023 A | | 1/2008 |
| TW | 201640230 A | | 11/2016 |

OTHER PUBLICATIONS

Notice of Allowance issued in U.S. Appl. No. 17/358,776 dated Feb. 14, 2023.

Non-Final Office Action issued in U.S. Appl. No. 17/358,776 dated Sep. 14, 2022.

* cited by examiner

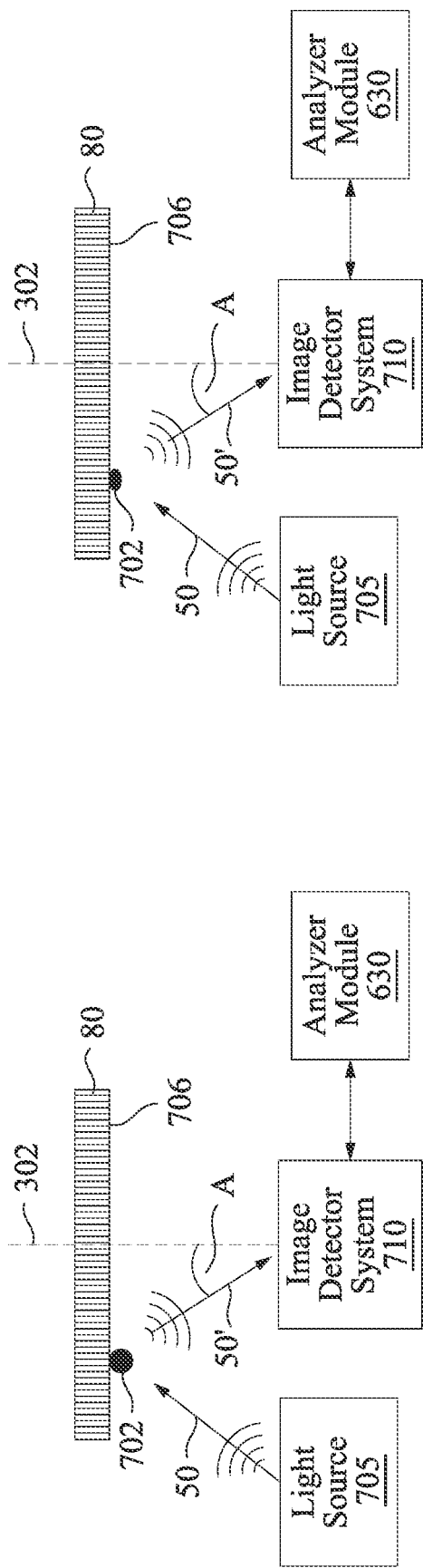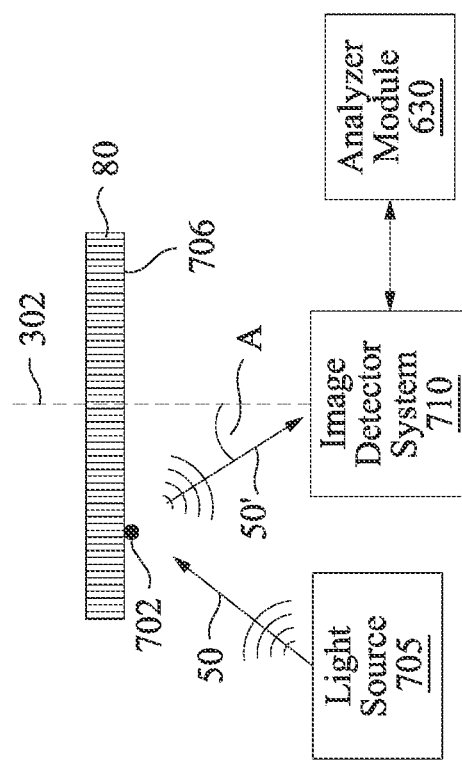
FIG. 7A
FIG. 7B
FIG. 7C

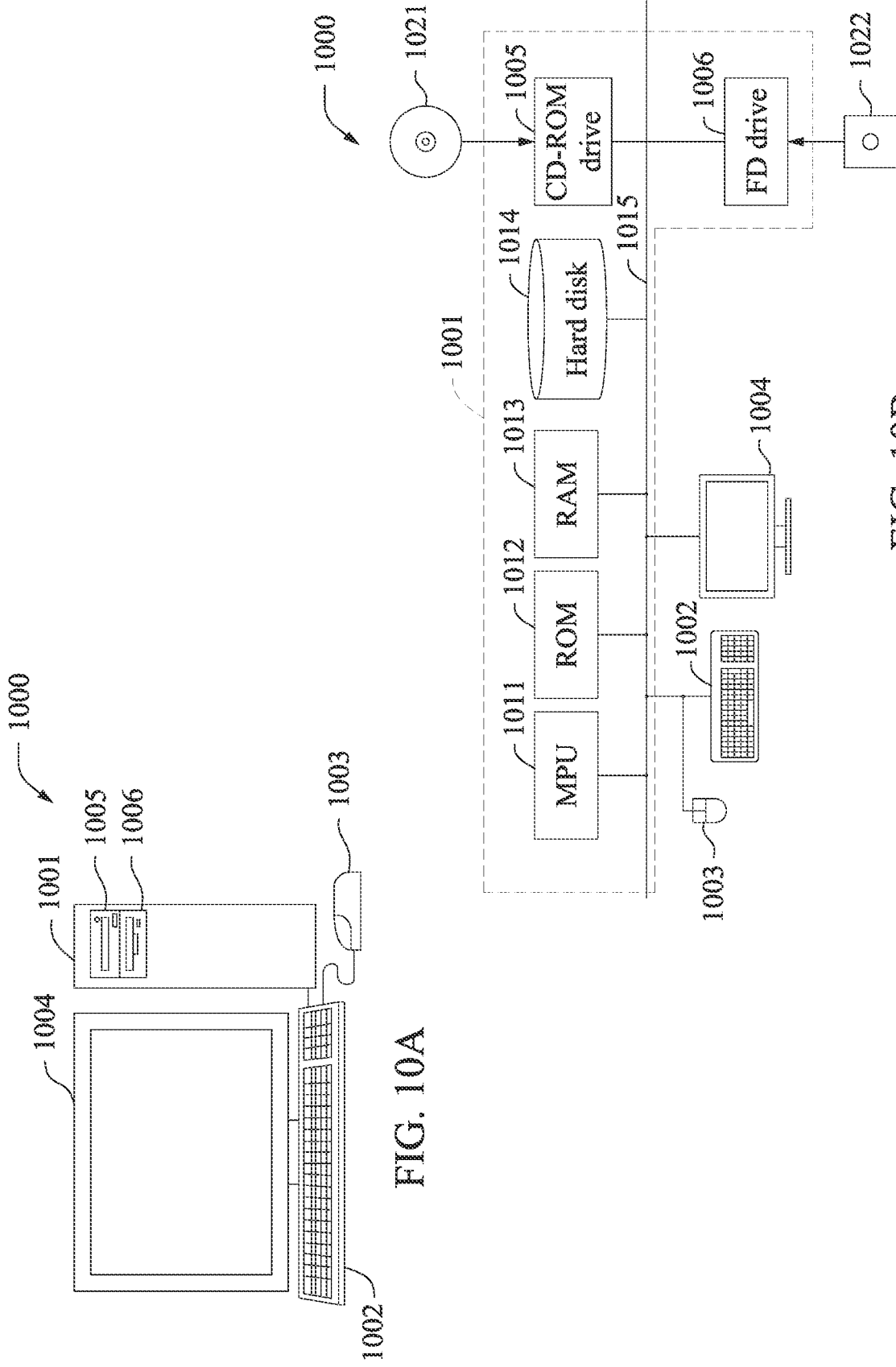

REDUCE MASK DEFECT IMPACT BY CONTAMINATION DECOMPOSE

CROSS-REFERENCE TO RELATED APPLICATIONS

This application is a Continuation Application of U.S. Ser. No. 17/358,776, filed Jun. 25, 2021, the entire disclosure of which is incorporated herein by reference.

BACKGROUND

During an integrated circuit (IC) design, a number of patterns of the IC, for different steps of IC processing, are generated on a substrate. The patterns may be produced by projecting, e.g., imaging, layout patterns of a mask on a photo resist layer of the wafer. A lithographic process transfers the layout patterns of the masks to the photo resist layer of the wafer such that etching, implantation, or other steps are applied only to predefined regions of the wafer. In general, the reticles, e.g., the masks, are stored in reticle libraries under a vacuum condition when the reticles are not used.

BRIEF DESCRIPTION OF THE DRAWING

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 7A, 7B, 7C, 7D, 7E, and 7F show exposure devices for measuring reflected projection light from a reflective reticle in accordance with some embodiments of the present disclosure.

FIGS. 10A and 10B illustrate an apparatus for cleaning a reticle and projecting layout patterns of the cleaned reticle on a semiconductor substrate in accordance with some embodiments of the present disclosure.

DETAILED DESCRIPTION

Figure 1:
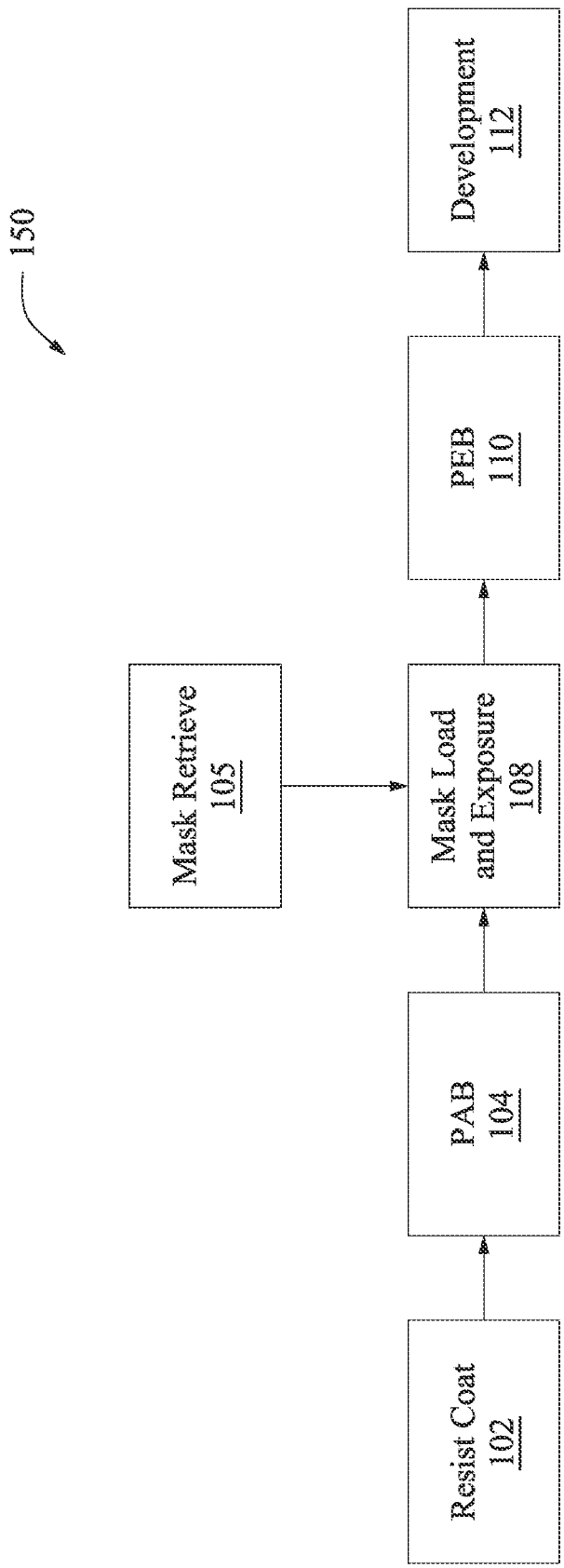
FIG. 1 shows a process flow for generating a photo resist pattern on a semiconductor substrate.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. In addition, the term "being made of" may mean either "comprising" or "consisting of." In the present disclosure, a phrase "one of A, B and C" means "A, B and/or C" (A, B, C, A and B, A and C, B and C, or A, B and C), and does not mean one element from A, one element from B and one element from C, unless otherwise described.

In some embodiments, the reticles are stored in the reticle library and the reticle library is maintained under vacuum condition to prevent the deposition of particles and hydrocarbon contamination on the reticles. However, when the reticle is used during a lithographic process, particles and hydrocarbon contamination may build up on the reticles. The particles and hydrocarbon contamination may damage critical dimension (CD) uniformity in the pattern produced on the photo resist layer of the wafer. In some embodiments, the reticle surfaces are cleaned from particles and hydrocarbon contamination with solvents after the reticle is retrieved from the reticle library. In some embodiments, the reticle surfaces are cleaned from particles and hydrocarbon contamination with solvents before the reticle is stored in the reticle library. Cleaning the reticles with solvents, may introduce other particles in the reticle library if the reticles is cleaned before being stored. Cleaning the reticles with solvents, may introduce other particles in the exposure device of the lithographic system if the reticle is cleaned after being retrieved from the reticle library. In addition, cleaning the reticle with solvents may introduce a long delay in the lithographic process. Thus, in some embodiments, the reticles are cleaned offline. The reticles are retrieved from the reticle library, the retrieved reticles are cleaned, and the reticles are stored again in the reticle library.

When the reticles are retrieved from the reticle library and are used for the lithographic process, particles and/or hydrocarbon contamination can build up on the mask that can degrade the mask and cause non-uniformity in the critical dimension (CD) of the wafer. Therefore, it is desirable to clean the reticles before performing the lithographic process. In some embodiments, the lithographic system includes two exposure devices. One exposure device is used for projecting the reticles on a photo resist layer of a wafer to pattern the wafer. Another exposure device with a separate radiation source, e.g., an EUV radiation source, is used for irradiating a surface layer of the reticle. In some embodiments, the energy of the irradiation is used to decompose the particles or a hydrocarbon contamination layer deposited on the surface layer of the reticle. In addition, the more the surface layer of the reticle is irradiated, the more the particles and the hydrocarbon contamination layer is decomposed. In some embodiments, the reticle is a reflective reticle and irradiating the surface layer of the reticle for a long time not only cause delay in the lithographic process, the extra irradiation may damage the layers of the reticle. Damaging the layers of the reticle, e.g., the reflective layers of the reflective reticle may damage CD uniformity. Therefore, it is desirable to irradiate the surface layer of the reticle to reduce or eliminated the effect of the particles and the hydrocarbon contamination on the surface layer of the reticle but do not damage the structure, e.g., the reflective structure, of the reticle. Thus, it is desirable to irradiate the surface layer of the reticle to get an optimum improvement in CD uniformity (CDU) before damaging the reticle structure.

Figure 5B:
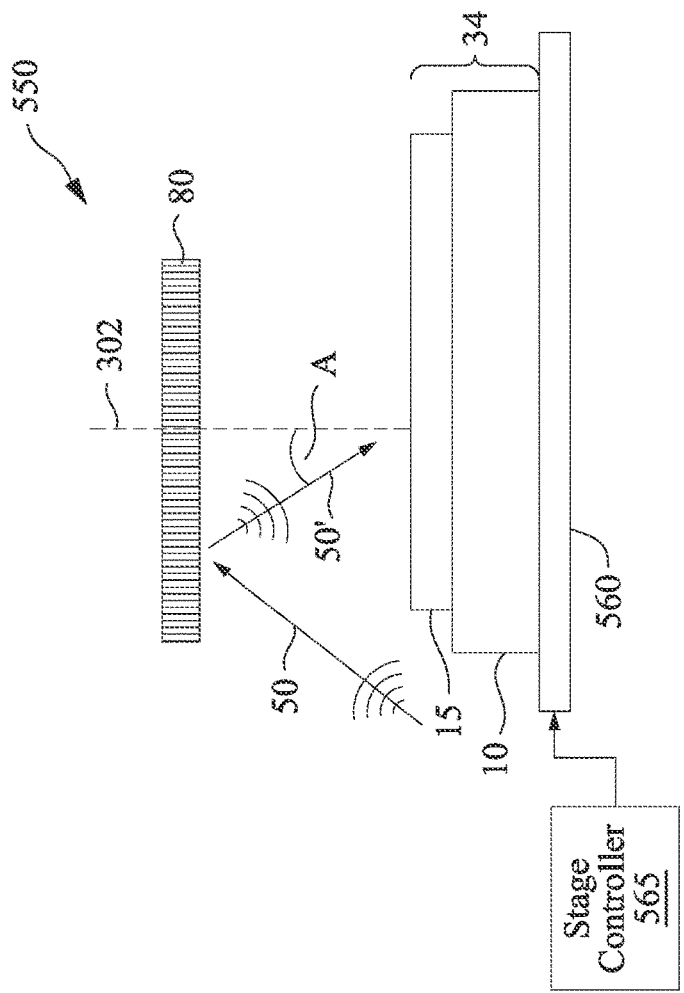
FIGS. 5A and 5B show cross-sectional views of a reflective reticle structure and projecting the reflective reticle structure on a semiconductor device in an exposure device.

FIG. 1 shows a process flow 150 for generating a photo resist pattern on a semiconductor substrate. In some embodiments, the process flow 150 is performed by the control system 800 of FIG. 8 and/or the computer system 1000 of FIGS. 10A and 10B. In a resist coat operation 102, a resist layer of a resist material is disposed, e.g., coated, on a top surface of a substrate, e.g., a wafer or a work piece. As shown in FIG. 5B, a photo resist layer 15 is disposed over a semiconductor substrate 10. The post application bake (PAB) is performed at a PAB operation 104 and the semiconductor substrate 10 including the photo resist layer 15 is baked to drive out solvent in the resist material and solidify the photo resist layer 15 on top of the semiconductor substrate 10.

In the present disclosure, the terms mask, photomask, and reticle are used interchangeably. In addition, the terms resist and photo resist are used interchangeably. At a mask retrieve operation 105, a reticle is retrieved from a reticle library. The mask retrieve operation 105 is described in more details with respect to FIG. 2. The retrieved reticle is loaded by a mask load and exposure operation 108 to an exposure device, which is described with respect to FIG. 4. The mask load and exposure operation 108 also projects the mask, using actinic radiation of a radiation source onto the photo resist layer 15 of the semiconductor substrate 10. In some embodiments, a layout pattern on the mask is projected by an extreme ultraviolet (EUV) radiation from an EUV light source onto the photo resist layer 15 to generate a resist pattern in the photo resist layer 15 on the semiconductor substrate 10. A post exposure bake (PEB) is performed at a PEB operation 110 on the wafer where the resist layer is further baked after being exposed to the actinic radiation and before being developed in a development operation 112. By applying a developer solution to the photo resist layer 15, the resist material of the resist layer is developed. For a positive tone resist material, in the development operation 112, the exposed regions are developed by applying a developer solution and then the developed regions are removed and the remaining regions generate the resist pattern of the photo resist layer 15. For a negative tone resist material, in the development operation 112, the non-exposed regions are developed by applying the developer solution and the developed regions are subsequently removed and the remaining regions generate the resist pattern of the photo resist layer 15. The mask is described with respect to FIG. 5A.

Figure 2:
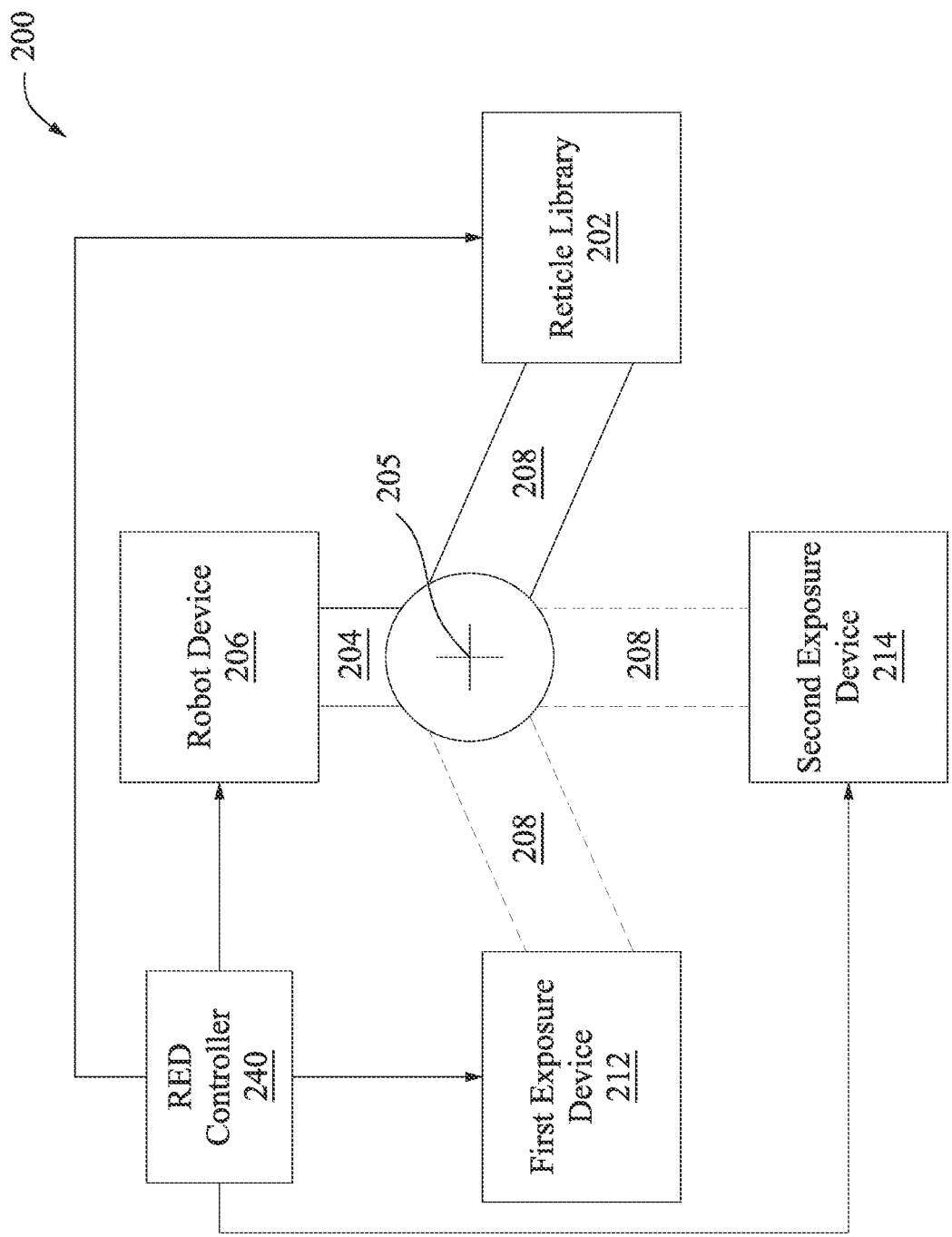
FIG. 2 shows a rapid exchange device (RED) for transferring reticles between different positions.

FIG. 2 shows a rapid exchange device (RED) 200 for transferring reticles between different positions. The RED 200 transfers reticles between a reticle library 202, a first exposure device 212 and a second exposure device 214. The RED 200 includes a robot device 206 with a robot arm. The robot arm includes a first movable segment 204 and a second movable segment 208. The second movable segment 208 rotates around the first pivot point 205. The first movable segment 204 rotates around a second pivot point (not shown) inside the robot device 206 and further moves the first pivot point and the second movable segment. The robot device 206 may rotate the first movable segment 204 and the second movable segment 208 around the respective pivot points to extend the robot arm to the reticle library 202, the first exposure device 212, or the second exposure device 214. In some embodiments, the robot device 206, the reticle library 202, the first exposure device 212, and the second exposure device 214 are maintained in vacuum condition.

The RED 200 also includes a RED controller 240 coupled to the reticle library 202, the robot device 206, the first exposure device 212, and the second exposure device 214. In some embodiments, the RED controller 240 commands the robot device 206 to retrieve a reticle from the reticle library 202 and load the reticle to the first or second exposure device 212 or 214. In some embodiments, the RED controller 240 commands the robot device 206 to retrieve a reticle from the first or second exposure device 212 or 214 and to load the reticle to the other exposure device. In some embodiments, the RED controller 240 commands the reticle library 202 to release one of the reticles to be retrieved. In some embodiments, the RED controller 240 commands the robot device 206 to load the reticle on a mask table of the first or second exposure device 212 or 214. The exposure devices 212 and 214 are described with respect to FIGS. 4, 5B, and 7A.

Figure 3:
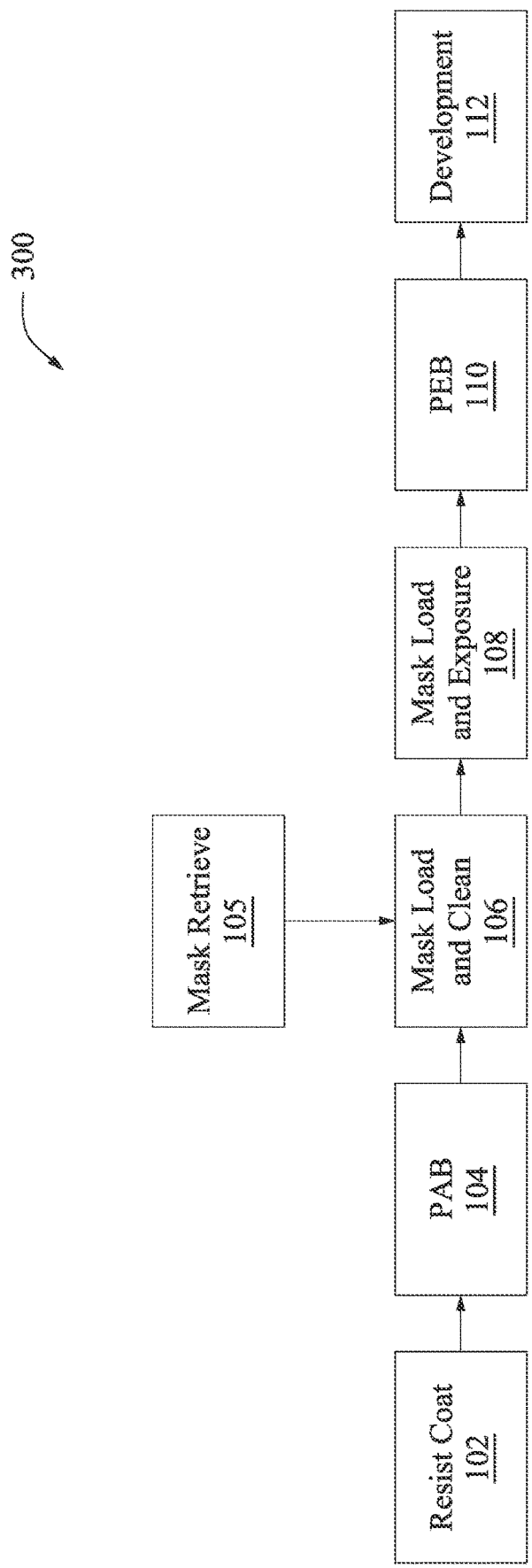
FIG. 3 shows a process flow for generating a photo resist pattern on a semiconductor substrate in accordance with some embodiments of the present disclosure.

FIG. 3 shows a process flow 300 for generating a photo resist pattern on a semiconductor substrate in accordance with some embodiments of the present disclosure. The process flow 300 includes the resist coat operation 102, the PAB operation 104, the PEB operation 110, and the development operation 112 of the process flow 150 of FIG. 1. In addition, the process flow 300 includes a mask retrieve operation 105, which is performed by the RED 200 of FIG. 2. In the mask retrieve operation 105, the RED controller 240 of FIG. 2 commands the robot device 206 and the reticle library 202. In response to the commands from the RED controller 240, the reticle library 202 releases a reticle and the robot arm of the robot device 206 extends into the reticle library 202 and retrieves the released reticle. The process flow 300 also includes a mask load and clean operation 106. In the mask load and clean operation 106, the RED controller 240 commands the robot device 206 to load the released reticle in the first exposure device 212. In addition, after the loading of the reticle in the first exposure device 212, the RED controller 240 commands a radiation source, e.g., an EUV light source of the first exposure device 212 to irradiate the surface of the reticle with a radiation of the radiation source for a predetermined amount of time to clean the surface of the reticle from particles and/or hydrocarbon contamination. In some embodiments, the radiation source is an EUV light source or another light source with suitable wavelength that may decompose the hydrocarbon contamination layer and the particles. In some embodiments, the surface of the reticle is a surface area of the reflective reticle that the radiation enters the reticle. In some embodiments, as at least part of the cleaning operation and to irradiate the surface of the reticle, the layout pattern of the reticle is projected onto a dummy wafer. Also, in the mask load and exposure operation 108, the reticle loaded in the first exposure device 212 is transferred to the second exposure device 214 and a radiation source of the second exposure source 214, projects the layout pattern of the reticle onto a photo resist layer of a substrate, e.g., the photo resist layer 15 of the substrate 10 of FIG. 5B to generate a resist pattern.

Figure 4:
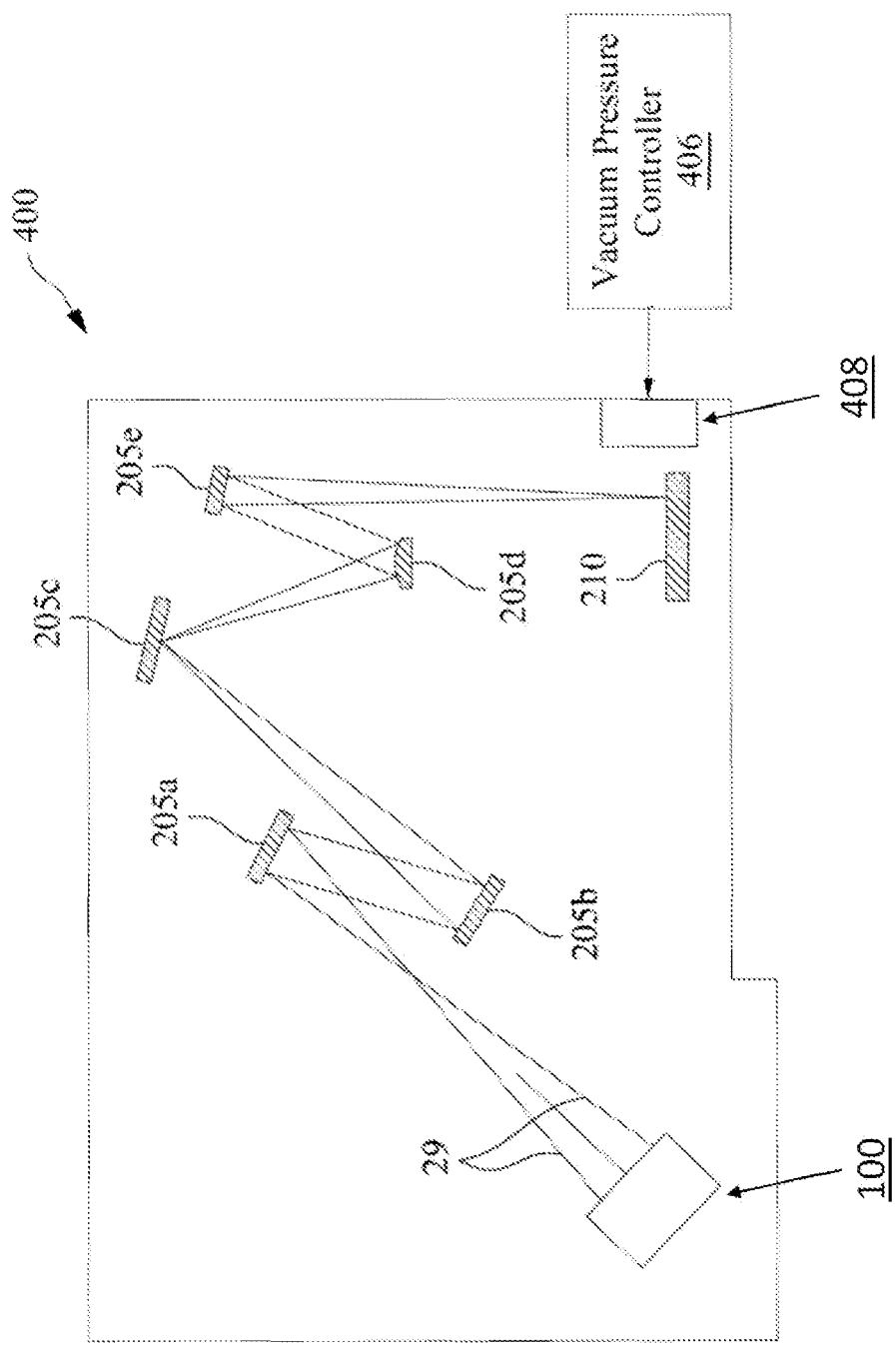
FIG. 4 shows a schematic view of an exposure device for generating a photo resist pattern on a wafer.

FIG. 4 shows a schematic view of an exposure device 400 for generating a photo resist pattern on a wafer. The exposure device 400, which is consistent with the second exposure device 214 shows the exposure of a photo resist coated substrate with a patterned beam of radiation 29 from a radiation source 100, e.g., an EUV radiation source. In some embodiments, the exposure device 400 is an integrated circuit lithography tool such as a stepper, scanner, step and scan system, direct write system, device using a contact and/or proximity mask, etc., provided with one or more optics 205a, 205b of an optical system, for example, to illuminate a patterning optic, such as a reticle, e.g., a reflective mask 205c, with a beam of EUV radiation, to produce a patterned beam, and one or more reduction projection optics 205d, 205e, of the optical system for projecting the patterned beam onto the target semiconductor substrate 210, which is consistent with the semiconductor substrate 10 of FIG. 5B. In some embodiments, the photo resist layer consistent with the photo resist layer 15 of FIG. 5B is disposed over the semiconductor substrate 210. A mechanical assembly (not shown) may be provided for generating a controlled relative movement between the target semiconductor substrate 210 and patterning optic, e.g., a reflective mask 205c. By the controlled relative movement, different dice of the substrate are patterned. In some embodiments, the exposure device 400 is an EUV lithography (EUVL) exposure device. As further shown, the EUVL exposure device of FIG. 4 further includes the EUV radiation source 100 to irradiate the target semiconductor substrate 210. In some embodiments, because gas molecules absorb EUV light, the lithography system for the EUV lithography patterning, e.g., the exposure device 400 is under a vacuum environment to avoid EUV intensity loss. In some embodiments, a pressure inside the exposure device 400 is sensed by a pressure sensor 408 inside the exposure device 400 and is controlled by a vacuum pressure controller 406 that is coupled to the exposure device 400. In some embodiments, the reflective mask 205c is consistent with the reticle 80 described below with respect to FIG. 5A. In some embodiments, the vacuum pressure controller 406 is included in the RED controller 240 of FIG. 2.

In some embodiments, the target semiconductor substrate 210 is a dummy wafer and the exposure device 400 is consistent with the first exposure device 212. As described with respect to FIG. 2, the retrieved reticle from the reticle library 202 is loaded as the reflective mask 205c to the exposure device 400. In some embodiments, the semiconductor substrate 210 of FIG. 4 is a dummy wafer and the reflective mask 205c is irradiated with the radiation of the radiation source 100 for a predetermined amount of time to clean the surface of the reticle from particles and/or hydrocarbon contamination.

Figure 5A:
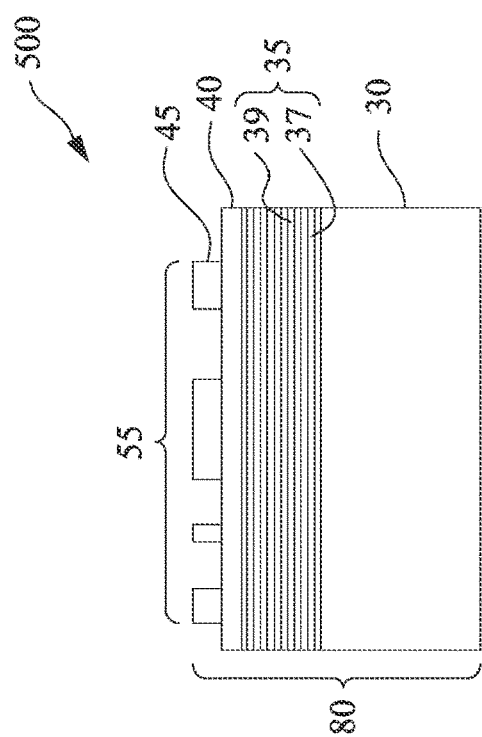

FIGS. 5A and 5B show cross-sectional views of a reflective reticle structure 80 and projecting the reflective reticle structure 80 on a semiconductor device 34 in an exposure device. FIG. 5A shows the cross-sectional view 500 of the reflective reticle 80, e.g., a reflective mask. As noted above, the terms mask, photomask, and reticle may be used interchangeably. The reflective reticle structure 80 is consistent with reflective mask 205c of FIG. 4 and is used in the exposure device 400 of FIG. 4. As shown in FIG. 5A, the reflective reticle 80 includes a substrate 30 with a suitable material, such as a low thermal expansion material or fused quartz. In various examples, the material includes $TiO_2$ doped $SiO_2$, or other suitable materials with low thermal expansion. The mask includes multiple reflective layers (ML) 35 deposited on the substrate 30. The ML includes a plurality of film pairs, film 37 and film 39, such as molybdenum-silicon (Mo/Si) film pairs (e.g., a layer of molybdenum above or below a layer of silicon in each film pair). Alternatively, the ML 35 may include molybdenum-beryllium (Mo/Be) film pairs, or other suitable materials that are configurable to highly reflect the EUV light. The mask may also include a capping layer 40, such as ruthenium (Ru), disposed on the ML for protection. The mask further includes an absorption layer 45, such as a tantalum boron nitride (TaBN) layer, deposited over the ML. The absorption layer 45 is patterned to define a layout pattern 55 for a layer of an integrated circuit (IC). Alternatively, another reflective layer may be deposited over the ML and is patterned to define a layer of an integrated circuit, thereby forming an EUV phase shift mask.

FIG. 5B shows exposing the photo resist layer disposed over a semiconductor device to radiation. FIG. 5B is a simplified drawing consistent with FIG. 4 for projecting a reflected mask on a substrate. FIG. 5A also shows the semiconductor device 34 that includes a photo resist layer 15 that is disposed on a semiconductor substrate 10 and is consistent with the semiconductor substrate 210 of FIG. 4. FIG. 5B further shows a radiation beam 50 that is originated from an EUV light source, e.g., EUV light source 100 of FIG. 4. The radiation beam 50 is directed to the reticle 80, e.g., a reflective photomask, where the reflected beam 50' is reflected from the reflective photomask 80 and is incident onto the photo resist layer 15 of the semiconductor device 34. The incident angle of the reflected beam 50', which is defined with respect to a line 302 that is perpendicular to a top surface of the semiconductor substrate 10 is an angle A. In some embodiments, the semiconductor substrate 10, that is consistent with the semiconductor substrate 210 of FIG. 4, is mounted on stage 560 that is coupled to and controlled by a stage controller 565 for moving the semiconductor device 34 and exposing different locations of the semiconductor device 34. In some embodiments, as described, the exposure configuration 550 of FIG. 5B is part of the exposure device 400 of FIG. 4.

Figure 6:
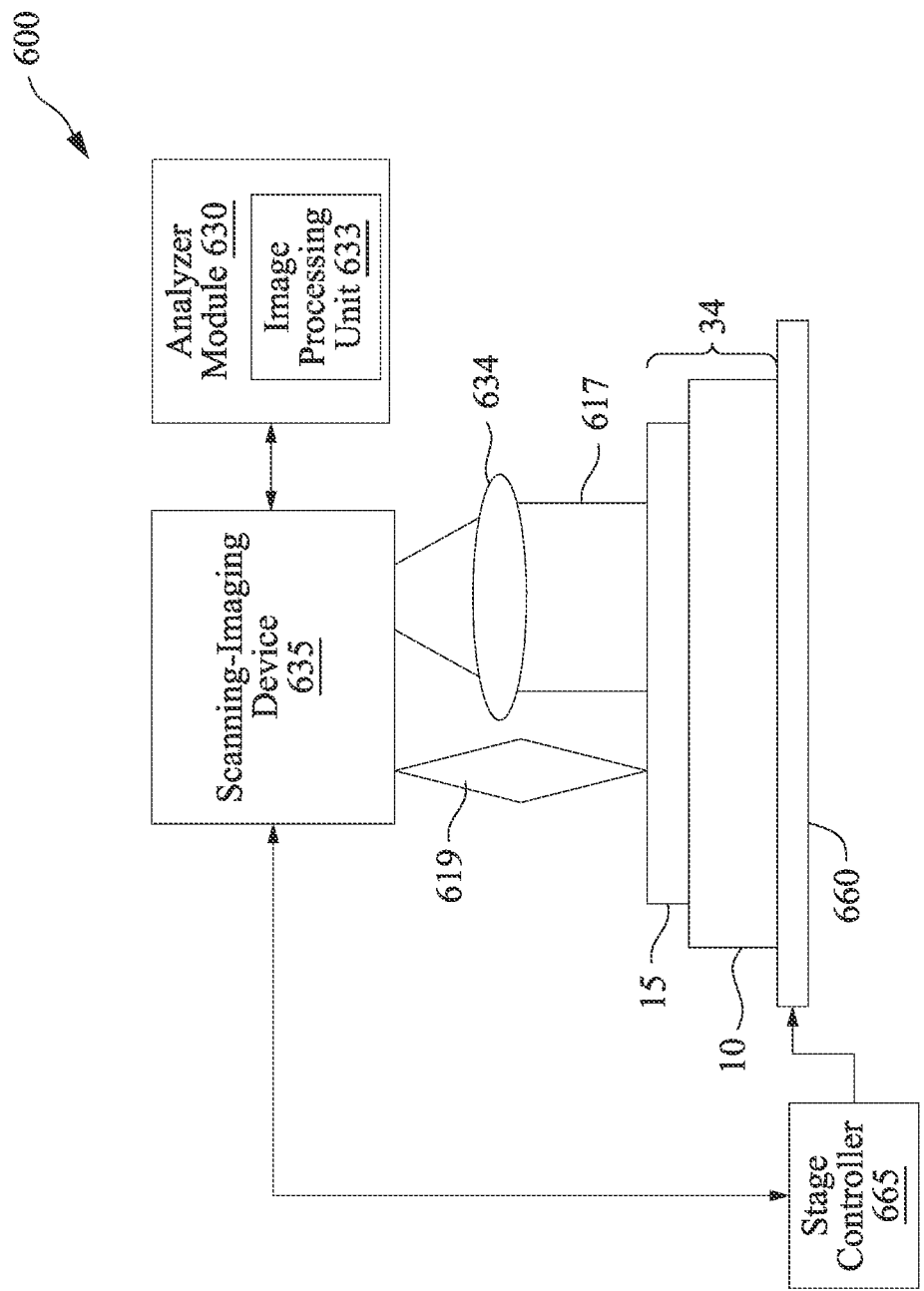
FIG. 6 shows an inspection system of the photo resist pattern disposed on a semiconductor substrate.

FIG. 6 shows an inspection system 600 of the photo resist pattern disposed on a semiconductor substrate 10. FIG. 6 shows the semiconductor device 34 on a stage 660 and the stage 660 is coupled to and controlled by a stage controller 665. As described with respect to FIG. 2, after the reticle is cleaned at the first exposure device 212, the reticle is loaded as the reflective mask 205c to the exposure device 400. In some embodiments, the semiconductor substrate 210 of FIG. 4 is the semiconductor device 34 of FIG. 5B and the reflective mask 205c is irradiated with the radiation beam of the radiation source 100 to project the layout patterns of the reflective mask 205c onto the photo resist layer 15 of the semiconductor device 34 to produce a resist pattern in the photo resist layer 15. In some embodiments, prior to the exposure, the substrate 10 including the photo resist layer 15 is baked in the PAB operation 104 to drive out solvent in the resist material and solidify the photo resist layer 15. In some embodiments, after the exposure, the PEB operation 110 is performed on the photo resist layer 15. In some embodiments, after the PEB operation 110, the development operation 112 is applied to the photo resist layer 15 to produce the resist pattern in the photo resist layer 15.

FIG. 6 also shows a scanning-imaging device 635 that generates a focusing beam 619 for scanning a top surface of the photo resist layer 15 and generating an image of the resist pattern at the top surface of the photo resist layer 15. In addition, FIG. 6 shows the scanning-imaging device 635 and a lens 634 that generates a uniform beam 617 for imaging a top surface of the photo resist layer 15 and generating the image of the resist pattern on the top surface of the photo resist layer 15. In addition, the scanning-imaging device 635 is coupled to an analyzer module 630 that includes an image processing unit 633 to receive and process the generated image of the top surface of the photo resist layer 15. In some embodiments, the generated image of the resist pattern on the top surface of the photo resist layer 15 is inspected. In some embodiments, the image processing unit of the analyzer module 630 performs one or more image processing and/or image recognition algorithms on the generated image of the top surface of the photo resist layer 15 and determines a CD measurement of the resist pattern produced in the photo resist layer 15. In some embodiments, the focusing beam 619 and the uniform beam 617 are light beams. In some embodiments, the focusing beam 619 is an electron beam. In some embodiments, as described before, the semiconductor device 34 is placed on the stage 665 and the stage controller 665 of the stage 660 moves the semiconductor device 34 with respect to the scanning-imaging device 635. In some embodiments, the stage controller 665 coordinates the scanning-imaging device 635 and the movement of the semiconductor device 34 that is placed on the stage 660 and enables the scanning-imaging device 635 to capture one or more images of the developed resist pattern of the photo resist layer 15 disposed on the semiconductor device 34 at different locations of the semiconductor device 34.

In some embodiments, the analyzer module 630 or the image processing unit 633 of the analyzer module 630 also determines a CD uniformity (CDU) of the developed resist pattern of the photo resist layer 15. If the determined CDU satisfies a predetermined criterion, e.g., if the CDU is better than one percent, the analyzer module 630 determines that the predetermined amount of time to clean the surface of the reticle from particles and/or hydrocarbon contamination is enough, e.g., is acceptable. However, if the CDU does not satisfy the predetermined criterion, the analyzer module 630 determines that the predetermined amount of time to clean the surface of the reticle from particles and/or hydrocarbon contamination is not enough, e.g., is not acceptable, and should be increased. In some embodiments, the analyzer module 630 gradually increases the predetermined amount of time, e.g., the predetermined amount of time is increased in steps of, for example, between about 2 percent to about 10 percent. After each step of increasing the predetermined amount of time, the CDU is measured and if the CDU satisfies the predetermined criterion, the increase does not continue and the predetermined amount of time is decided as the amount of time that CDU satisfies the predetermined criterion. In some embodiments, the predetermined amount of time depends on the details of the layout pattern of the mask and whether specific shapes or features exist in the layout pattern of the mask.

In some embodiments, the analyzer module 630 determines that the predetermined amount of time to clean the surface of the reticle from particles and/or hydrocarbon contamination is acceptable, however, the predetermined amount of time may be more than the time to satisfy the predetermined criterion. In some embodiments, the analyzer module 630 gradually decreases the predetermined amount of time, e.g., the predetermined amount of time is decreased in steps of, for example, between about 2 percent to about 10 percent. After each step of decreasing the predetermined amount of time, the CDU is measured and when at the step that the CDU does not satisfy the predetermined criterion, the decrease does not continue and the predetermined amount of time is decided as the amount of time before the immediate decrease that caused the CDU to dissatisfy the predetermined criterion. In some embodiments, the decided predetermined amount of time is increased by a predetermined percentage, e.g., between about 0.5 percent to about 1.5 percent, to increase reliability.

FIGS. 7A, 7B, 7C, 7D, 7E, and 7F show exposure devices for measuring reflected projection light from a reflective reticle in accordance with some embodiments of the present disclosure. FIGS. 7A, 7B, 7C, 7D, and 7E are similar to FIG. 5A that shows irradiating the reflected reticle 80 with a radiation beam 50. The light source 705 is consistent the radiation source 100 of FIG. 4 and the reflected reticle 80 is consistent with the reflective mask 205c of FIG. 4. However, contrary to the exposure device 400, the reflected beam 50' is not directed to a substrate but consistent with exposure device 212, the reflected beam 50' is directed to a light detector system 710 for detecting the projected image, e.g., the projected layout pattern, from the reflected reticle 80. The detected image is transferred to the analyzer module 630 for analysis. Consistent with FIG. 5B, the incident angle of the reflected beam 50', which is defined with respect to a line 302 that is perpendicular to a surface 706 of the reticle is the angle A.

As shown in FIGS. 7A, 7B, and 7C a particle 702 is located on the surface 706 of the reticle where the radiation beam 50 enters the reticle 80. The particle 702 may degrade the projected image during lithography and may affect CD uniformity. In some embodiments, the light source 705 is an EUV light source and irradiating the particle 702 with the EUV radiation decomposes the particle 702. As shown in the progression from FIG. 7A to FIG. 7B, and from FIG. 7B to FIG. 7C, the particle 702 is decomposed and becomes smaller. In some embodiments, irradiating the reticle 80 with the radiation beam 50 and capturing the projected image of the reticle 80 by the image detector system continues for a predetermined amount of time such that the particle 702 does not affect the CDU and the CDU satisfies a threshold CDU.

Figure 7D:
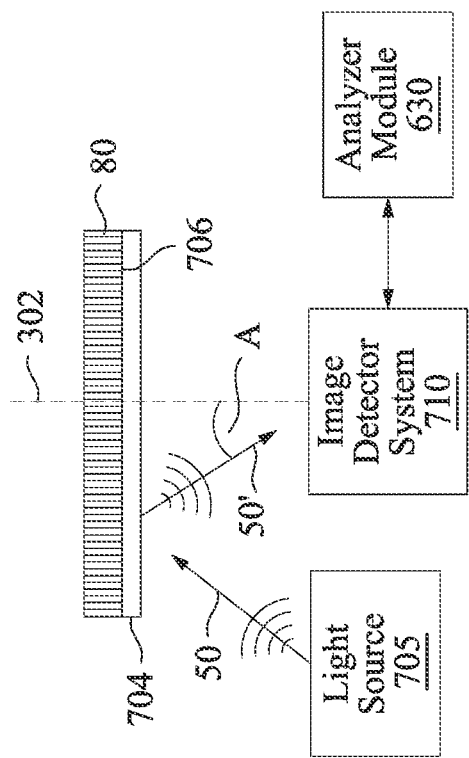
Figure 7E:
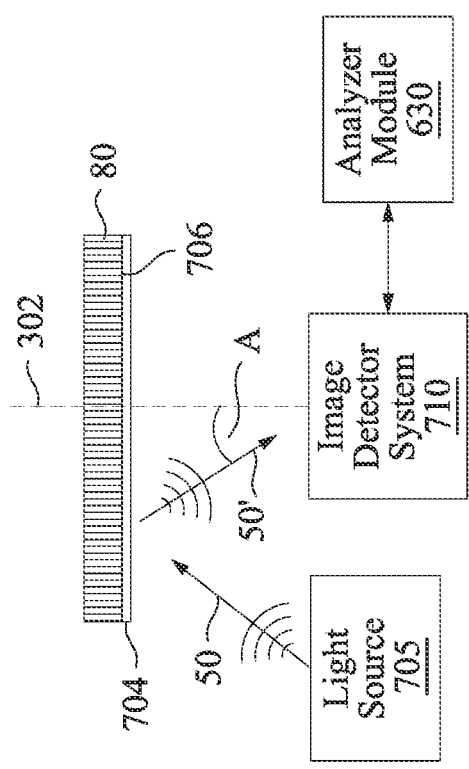

As shown in FIGS. 7D and 7E a contamination layer 704 containing hydrocarbon contamination is deposited on the surface 706 of the reticle where the radiation beam 50 enters the reticle 80. The contamination layer 704 may degrade the projected image during lithography and may affect CD uniformity. In some embodiments, irradiating the contamination layer 704 with the EUV radiation decomposes the contamination layer 704. As shown in the progression from FIG. 7D to FIG. 7E, the contamination layer 704 is decomposed and becomes thinner. In some embodiments, irradiating the reticle 80 with the radiation beam 50 and capturing the projected image of the reticle 80 by the image detector system continues for a predetermined amount of time such that the contamination layer 704 does not affect the CDU and the CDU stays within a threshold between about one to two percent in 3 nm process for 3 nm semiconductor node.

Figure 7F:
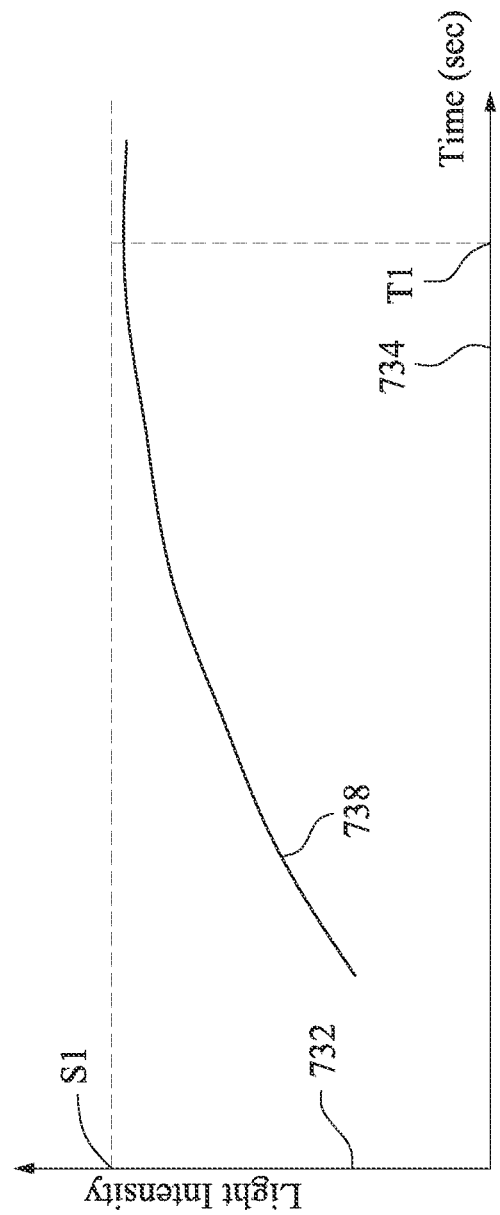

In some embodiments, the projected image of the reticle 80 that is captured by the image detector system 710 is additionally continuously scanned by the image detector system 710. The scanning provides detected points of the entire projected image of the reticle 80 for different instances of time. In some embodiments, the scanned projected image of the reticle 80 provides time variations of the entire projected image as well as spatial variation of the projected image at a specific instance of time. FIG. 7F shows a time variation, on temporal coordinate 734, of the intensity, on coordinate 732, of one specific point of the captured projected image of the reticle 80. As shown in FIG. 7F, the reflected intensity of the specific point increases in time until a time T1 that the intensity curve saturates at level S1 and does not increase further. The curve 738 is an indication that at the specific point a particle existed or hydrocarbon contamination existed and the irradiation by the radiation beam 50 on the specific point decomposed the particle and increased the reflected light intensity. In some embodiments, the time T1 is the predetermined amount of time that is needed to clean the surface 706 of the reticle 80 and further irradiating the reticle 80 does not improve the reflected light intensity. In some embodiments, when the curve 738 saturates and increases by less than a threshold value in a predefined time, e.g., the curve 738 increase by less than one percent in 5 seconds, the cleaning stops and the time T1 is reached. In some embodiments, the time T1 is between about 50 seconds to about 100 seconds. In some embodiments, the curve 738 is constructed for multiple points on the surface of the reticle 80, the time T1 is measured for the multiple points, and a final T1 is determined as the maximum of the measured T1s.

Figure 8:
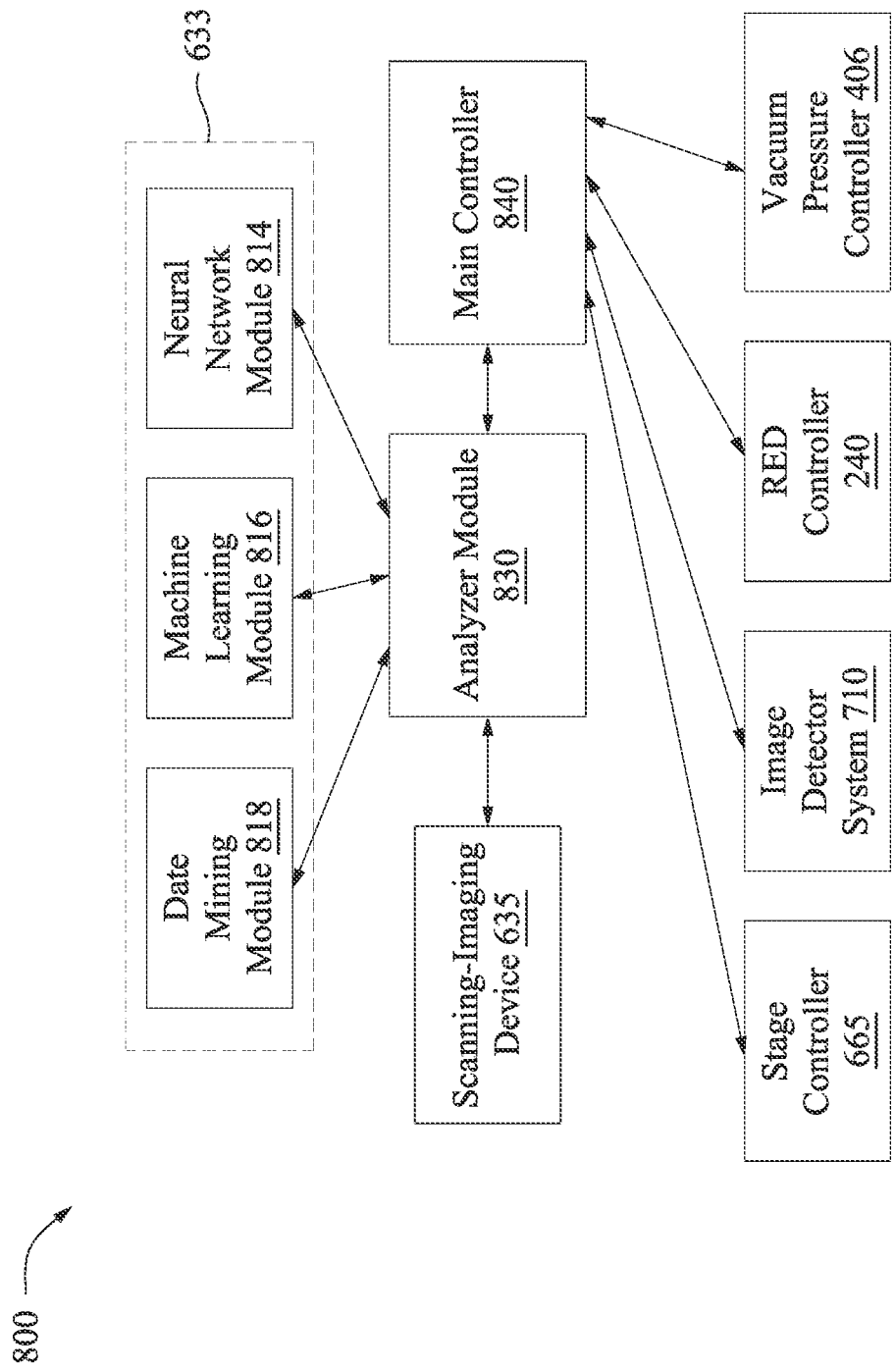
FIG. 8 shows a control system for cleaning a reticle and projecting layout patterns of the cleaned reticle on a semiconductor substrate in accordance with some embodiments of the present disclosure.

FIG. 8 shows a control system 800 for cleaning a reticle and projecting layout patterns of the cleaned reticle on a semiconductor substrate in accordance with some embodiments of the present disclosure. The control system 800 includes an analyzer module 830 and a main controller 840 coupled to each other. In some embodiments, the control system 800 includes the stage controller 665 of FIG. 6, the image detector system 710 of FIG. 7A, the RED controller 240 of FIG. 2, the scanning-imaging device 635 of FIG. 6, and the vacuum pressure controller 406 of FIG. 4. In some embodiments, the main controller 840 is coupled to and controls the stage controller 665, the image detector system 710, the RED controller 240, the scanning-imaging device 635, and the vacuum pressure controller 406. In some embodiments, the main controller 840 is directly coupled to the scanning-imaging device 635 or is coupled to the scanning-imaging device 635 via the analyzer module 830.

In some embodiments, the analyzer module 830 is consistent with or includes the analyzer module 630 of FIG. 6. In some embodiments, the main controller 840 commands the scanning system 635, via the analyzer module 830, to capture an image of the resist pattern on a semiconductor substrate and determine, e.g., measure, the CDU of the resist pattern disposed on the semiconductor substrate. As described above, the analyzer module 830 determines, based on the measured CDU, if the surface of the reticle is cleaned. In some embodiments, the main controller 840 commands the stage controller 665 to move the stage 660 to capture one or more images of the resist pattern disposed on the semiconductor substrate at different locations. In some embodiments, the main controller 840 commands the vacuum pressure controller 406 to maintain a vacuum environment inside the first and second exposure devices 212 and 214 and to maintain a vacuum environment inside the reticle library 202. In some embodiments, the main controller 840 commands the RED controller 240 to clean a surface of the reticle in a first exposure device 212 and to load the cleaned reticle to a second exposure device 214 and project the layout pattern of the reticle on a photo resist layer of substrate. In some embodiments, the main controller 840 commands the image detector system 710 to capture a reflected image from the reticle during the cleaning of the reticle and to transfer the captured reflected image to the analyzer module 830 for analysis.

In some embodiments, the analyzer module 830 includes a data mining module 818, a machine learning module 816, and a neural network module 814. As described before, the analyzer module 830 includes the image processing unit 633 and the image processing unit 633 includes the data mining module 818, the machine learning module 816, and the neural network module 814 in some embodiments. In some embodiments, the data mining module 818, the machine learning module 816, or the neural network module 814, continuously scans the captured reflected image and determines the data corresponding to the reflected light from different locations of the reticle, analyses the data, and determines the variations of data in time to determine when the surface of the reticle is cleaned from particles and/or hydrocarbon contamination.

Figure 9:
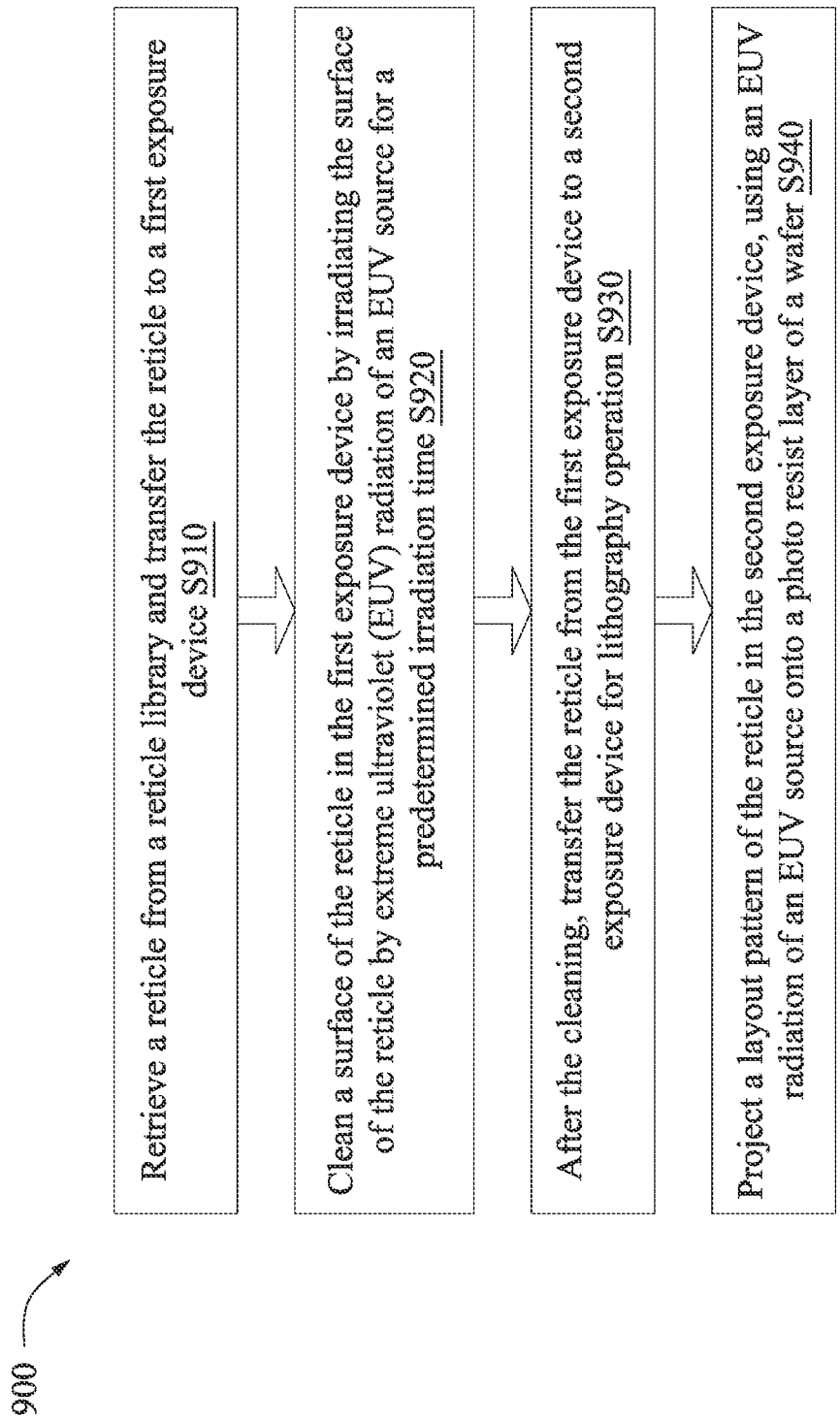
FIG. 9 shows a flow diagram of an exemplary process for cleaning a reticle and projecting layout patterns of the cleaned reticle on a semiconductor substrate in accordance with some embodiments of the present disclosure.

FIG. 9 illustrates a flow diagram of an exemplary process 900 for cleaning a reticle and projecting layout patterns of the cleaned reticle on a semiconductor substrate in accordance with some embodiments of the present disclosure. The process 900 or a portion of the process 900 may be performed by the system of FIG. 2. In some embodiments, the process 900 or a portion of the process 900 is performed and/or is controlled by the computer system 1000 described below with respect to FIGS. 10A and 10B. In some embodiments, the process 900 or a portion of the process 900 is performed by the system 800 of FIG. 8 described above. The method includes an operation S910, where a reticle from a reticle library is retrieved from a reticle library and is transferred to a first exposure device. As shown in FIG. 2, a reticle is retrieve by the robot arm of the robot device 206 from the reticle library 202. After the retrieval of the reticle, the robot arm delivers the reticle to the first exposure device 212.

In operation S920, a surface of the reticle is cleaned, in the first exposure device, by irradiating the surface of the reticle by EUV radiation of an EUV source for a predetermined amount of time. As shown in FIGS. 7A, 7B, and 7C, the surface of the reticle 80 is cleaned, in the first exposure device 212, from particles 702. As shown in FIGS. 7D and 7E, the surface of the reticle 80 is cleaned from hydrocarbon contamination 704.

In operation S930, after the cleaning, the reticle is transferred from the first exposure device to a second exposure device for lithography operation. As shown in FIG. 2, after cleaning the reticle, the reticle is transferred from the first exposure device 212 to the second exposure device 214. The reticle is transferred by the robot arm of the robot device 206. In the second exposure device the lithography operation is performed using the layout patterns of the reticle.

In operation S940, in the second exposure device, a layout pattern of the reticle is projected onto a photo resist layer of a wafer. As shown in FIG. 4 or 5B, the layout pattern of the respective reflective mask 205c or 80 is projected onto a photo resist layer of the respective semiconductor substrate 210 or 10.

FIGS. 10A and 10B illustrate an apparatus for cleaning a reticle and projecting layout patterns of the cleaned reticle on a semiconductor substrate in accordance with some embodiments of the present disclosure. In some embodiments, the computer system 1000 is used for performing the functions of the modules of FIG. 8 that include the main controller 840, the analyzer module 830 or 630, the stage controller 665, the RED controller 240, the vacuum pressure controller 406, and the image processing unit 633 of the analyzer module 630. In some embodiments, the computer system 1000 is used to execute the process 900 of FIG. 9.

FIG. 10A is a schematic view of a computer system that performs the functions of an apparatus for cleaning reticles and projecting layout patterns of the cleaned reticles. All of or a part of the processes, method and/or operations of the foregoing embodiments can be realized using computer hardware and computer programs executed thereon. In FIG. 10A, a computer system 1000 is provided with a computer 1001 including an optical disk read only memory (e.g., CD-ROM or DVD-ROM) drive 1005 and a magnetic disk drive 1006, a keyboard 1002, a mouse 1003, and a monitor 1004.

FIG. 10B is a diagram showing an internal configuration of the computer system 1000. In FIG. 10B, the computer 1001 is provided with, in addition to the optical disk drive 1005 and the magnetic disk drive 1006, one or more processors, such as a micro processing unit (MPU) 1011, a ROM 1012 in which a program such as a boot up program is stored, a random access memory (RAM) 1013 that is connected to the MPU 1011 and in which a command of an application program is temporarily stored and a temporary storage area is provided, a hard disk 1014 in which an application program, a system program, and data are stored, and a bus 1015 that connects the MPU 1011, the ROM 1012, and the like. Note that the computer 1001 may include a network card (not shown) for providing a connection to a LAN.

The program for causing the computer system 1000 to execute the functions for cleaning reticles and projecting layout patterns of the cleaned reticles in the foregoing embodiments may be stored in an optical disk 1021 or a magnetic disk 1022, which are inserted into the optical disk drive 1005 or the magnetic disk drive 1006, and transmitted to the hard disk 1014. Alternatively, the program may be transmitted via a network (not shown) to the computer 1001 and stored in the hard disk 1014. At the time of execution, the program is loaded into the RAM 1013. The program may be loaded from the optical disk 1021 or the magnetic disk 1022, or directly from a network. The program does not necessarily have to include, for example, an operating system (OS) or a third party program to cause the computer 901 to execute the functions of the control system for cleaning reticles and projecting layout patterns of the cleaned reticles in the foregoing embodiments. The program may only include a command portion to call an appropriate function (module) in a controlled mode and obtain desired results.

According to some embodiments of the present disclosure, a method of cleaning a surface of a reticle includes retrieving a reticle from a reticle library and transferring the reticle to a first exposure device. The method also includes cleaning a surface of the reticle by irradiating the surface of the reticle, in the first exposure device, with a first extreme ultraviolet (EUV) radiation for a predetermined irradiation time and after the cleaning, transferring the reticle to a second exposure device for lithography operation. In an embodiments, the method further includes maintaining the first exposure device, the second exposure device, and the reticle library under a vacuum environment. In an embodiment, the reticle is retrieved from the reticle library and is transferred to the first exposure device by a robot arm of a rapid exchange device, the method further includes transferring the reticle from the first exposure device to the second exposure device by the robot arm of the rapid exchange device. In an embodiment, the method further includes projecting, by a second EUV radiation, a layout pattern of the reticle onto a photo resist layer of a wafer and developing the photo resist layer to generate a photo resist pattern on the wafer. In an embodiment, the first EUV radiation is generated from a first EUV source and the second EUV radiation is generated from a second EUV source different from the first EUV source. In an embodiment, the method further includes imaging a surface of the wafer to generate an image of the photo resist pattern on the wafer, analyzing the generated image of the photo resist pattern to determine critical dimension uniformity (CDU) of the photo resist pattern, and increasing the predetermined irradiation time if the determined CDU does not satisfy a threshold CDU. In and embodiment, the method further includes repeating the cleaning, the projecting, the developing, the imaging, the analyzing, and the increasing a irradiation time, until the determined CDU satisfies the threshold CDU and adjusting the predetermined irradiation time to the irradiation time that corresponds to the threshold CDU.

According to some embodiments of the present disclosure, a method of cleaning a surface of a reticle includes cleaning a surface of the reticle in the first exposure device by irradiating the surface of the reticle by extreme ultraviolet (EUV) radiation of a first EUV source for an irradiation time. After the cleaning, the method includes transferring the reticle from the first exposure device to a second exposure device for lithography operation. The method also includes projecting a layout pattern of the reticle in the second exposure device, using an EUV radiation of a second EUV source onto a photo resist layer of a wafer. In an embodiment, after the projecting, the method further includes developing the photo resist layer to generate a photo resist pattern on the wafer. In an embodiment, the reticle is a reflective reticle and the method further includes irradiating an entire surface of the reticle by an EUV beam at the first exposure device to clean the surface of the reticle, focusing a reflected light from the entire surface of the reticle onto an image detector to generate a detected reflected image, monitoring the detected reflected image during the irradiation time, and stopping the cleaning when an increase in each point of the detected reflected image is below a threshold value in a specific amount of time. In an embodiment, the reticle is a reflective reticle and the method further includes continuously scanning an entire surface of the reticle by continuously sampling the detected reflected image of the image detector to generate a detected scanned signal at the first exposure device during the cleaning of the surface of the reticle, monitoring the detected scanned signal of each location during the irradiation time, and stopping the cleaning when an increase in the detected scanned signal of each location is below a threshold value in a specific amount of time. The detected scanned signal at each time corresponds to a location on the surface of the reticle. In an embodiment, the method further includes analyzing the detected scanned signal by one of a pattern recognition algorithm, a data mining algorithm, or a neural network algorithm to determine corresponding locations of the surface of the reticle that require cleaning. In an embodiment, the first EUV source of the first exposure device produces EUV radiation at 13.5 nm. In an embodiment, the method further includes maintaining the first exposure device and the second exposure device under a vacuum environment.

According to some embodiments of the present disclosure, a system for cleaning a surface of a reticle includes a main controller, an analyzer module coupled to the main controller, and a rapid exchange device having an extendable robot arm. The system further includes a first exposure device that includes a first reticle stage for holding a reticle and a first EUV light source. The system also includes a second exposure device that includes a second reticle stage for holding a reticle and a second EUV light source. The system includes a stage for holding a wafer and an optical system. The main controller commands the first EUV light source to turn on to clean a surface of the reticle in the first reticle stage of the first exposure device by irradiating the surface of the reticle by EUV radiation of the first EUV source for a predetermined irradiation time. After the cleaning, the main controller commands the rapid exchange device to transfer the reticle from the first exposure device to the second reticle stage of the second exposure device for lithography operation. After the transferring, the main controller commands the second EUV light source to turn on and to project a layout pattern of the reticle, through the optical system, onto a photo resist layer of a wafer. In an embodiment, the system further includes a development system to develop the photo resist layer of the wafer after the projection of the layout pattern of the reticle and to generate photo resist pattern on the wafer. In an embodiment, an imaging device is mounted over the stage. The system further includes that in response to a command from the main controller, the imaging device captures an image of the developed photo resist pattern on the surface of the wafer and transfers the captured image to the analyzer module. The analyzer module determines a CDU of the photo resist pattern on the wafer. In an embodiment, the system further includes a reticle library to hold a plurality of reticles and a pressure controller coupled to the main controller. The pressure controller maintains a pressure of the first exposure device, the second exposure device, and the reticle library under a vacuum environment. In an embodiment, the system further includes a reticle library and prior to the irradiating the surface of the reticle by the EUV radiation, the main controller sends a command to the rapid exchange device to retrieve the reticle from the reticle library and to transfer the reticle from to the first exposure device. In an embodiment, the first and second EUV light sources have a wavelength of 13.5 nm.

As described in the foregoing embodiments, the surface of a reticle is cleaned by decomposing the particles deposited on a surface of the reticle and decomposing a hydrocarbon layer disposed on a surface of the reticle by EUV radiation. The particles and the hydrocarbon layer on the surface of the reticle are cleaned with no solvent and by using the EUV radiation.

The foregoing outlines features of several embodiments or examples so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments or examples introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
   cleaning a surface of a reticle by irradiating the surface of the reticle in a first exposure device for a predetermined irradiation time;
   projecting, by an EUV radiation, a layout pattern of the reticle onto a photo resist layer of a wafer in a second exposure device;
   developing the photo resist layer to generate a photo resist pattern on the wafer;
   imaging a surface of the wafer to generate an image of the photo resist pattern on the wafer;
   analyzing the generated image of the photo resist pattern to determine critical dimension uniformity (CDU) of the photo resist pattern; and
   adjusting the predetermined irradiation time until the determined CDU satisfies a predetermined criterion.

2. The method of claim 1, wherein when the determined CDU is better than the predetermined criterion, decrease the predetermined irradiation time step by step, after each step of decreasing the predetermined irradiation time, the CDU is measured and when at the step that the CDU does not satisfy the predetermined criterion, the decrease does not continue and the predetermined irradiation time is decided as an amount of time before the immediate decrease that caused the CDU to dissatisfy the predetermined criterion.

3. The method of claim 1, wherein when the determined CDU does not satisfy the predetermined criterion, increases the predetermined irradiation time step by step, after each step of increasing the predetermined irradiation time, the CDU is measured and if the CDU satisfies the predetermined criterion, the increase does not continue and the predetermined amount of time is decided as an amount of time that CDU satisfies the predetermined criterion.

4. The method of claim 3, wherein when the determined CDU does not satisfy the predetermined criterion, the predetermined amount of time is increased by a predetermined percentage between 0.5 percent to 1.5 percent.

5. The method of claim 1, further comprising:
   maintaining the first exposure device and the second exposure device under a vacuum environment.

6. The method of claim 1, further comprising:
   transferring the reticle from the first exposure device to the second exposure device by a robot arm of a rapid exchange device.

7. The method of claim 1, wherein the reticle is a reflective reticle.

8. A system comprising:
   a first exposure device, wherein the first exposure device comprises a first EUV source, and the first EUV source is configured to clean a surface of a reticle in the first exposure device by irradiating the surface of the reticle for an irradiation time;
   a radiation beam configured to focus a reflected light from an entire surface of the reticle onto an image detector to generate a detected reflected image;
   an analyzer module configured to monitor the detected reflected image during the irradiation time and stop cleaning when an increase in each point of the detected reflected image is below a threshold value in a specific amount of time;
   a second exposure device;
   a rapid exchange device configured to transfer the reticle from the first exposure device to the second exposure device for lithography operation, wherein the second exposure device comprises a second EUV source, the second EUV source is configured to generate a second EUV radiation, and the second EUV radiation projects a layout pattern of the reticle in the second exposure device onto a photo resist layer of a wafer;
   wherein the reticle is a reflective reticle.

9. The system according to claim 8, further comprising a development system configured to develop the photo resist layer to generate a photo resist pattern on the wafer.

10. The system according to claim 8, further comprising an image detector system configured to continuously scan the entire surface of the reticle by continuously sampling a detected reflected image of the image detector to generate a detected scanned signal at the first exposure device during the cleaning of the surface of the reticle, wherein the detected scanned signal at each time corresponds to a location on the surface of the reticle.

11. The system according to claim 10, wherein the analyzer module is further configured to analyze the detected scanned signal by one of a pattern recognition algorithm, a data mining algorithm, or a neural network algorithm to determine corresponding locations of the surface of the reticle that require cleaning.

12. The system according to claim 8, wherein the first EUV source of the first exposure device is configured to produce EUV radiation at 13.5 nm.

13. The system according to claim 8, further comprising a vacuum pressure controller, wherein the vacuum pressure controller maintains the first exposure device and the second exposure device under a vacuum environment.

14. The system according to claim 8, wherein the rapid exchange device comprises a robot arm.

15. A system comprising:
a main controller;
an analyzer module coupled to the main controller;
a first exposure device comprising a first EUV light source;
a second exposure device comprising:
  a second reticle stage;
  a second EUV light source;
  a stage for holding a wafer;
  an imaging device mounted over the stage, wherein in response to a command from the main controller, the imaging device is configured to capture an image of a developed photo resist pattern on a surface of the wafer and to transfer the captured image to the analyzer module, and wherein the analyzer module is configured to determine a CDU of the photo resist pattern on the wafer; and
  an optical system; and
a development system configured to develop the photo resist layer of the wafer after a projection of a layout pattern of the reticle to generate the photo resist pattern on the wafer.

16. The system according to claim 15, wherein the first exposure device further comprises a first reticle stage for holding the reticle, and the main controller is configured to command the first EUV light source to turn on, to irradiate EUV radiation from the first EUV light source, and to clean a surface of the reticle in the first reticle stage of the first exposure device by irradiating the surface of the reticle by the EUV radiation of the first EUV source for a predetermined irradiation time.

17. The system according to claim 15, further comprises a rapid exchange device having an extendable robot arm, wherein the main controller is configured to command the rapid exchange device to transfer the reticle, by the extendable robot arm, from the first exposure device to the second reticle stage of the second exposure device for lithography operation.

18. The system according to claim 15, wherein the main controller is configured to command the second EUV light source to turn on, to irradiate EUV radiation from the second EUV light source, and to project the layout pattern of the reticle, through the optical system, onto the photo resist layer of a wafer.

19. The system according to claim 15, wherein the reticle is a reflective reticle.

20. The system according to claim 15, wherein the first and second EUV light sources have a wavelength of 13.5 nm.

* * * * *